United States Patent
Radulescu

(10) Patent No.: US 9,245,890 B2
(45) Date of Patent: Jan. 26, 2016

(54) METHOD OF MANUFACTURING PRECISE SEMICONDUCTOR CONTACTS

(71) Applicant: Cree, Inc., Durham, NC (US)

(72) Inventor: Fabian Radulescu, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/184,976

(22) Filed: Feb. 20, 2014

(65) Prior Publication Data

US 2015/0236017 A1    Aug. 20, 2015

(51) Int. Cl.

| | | |
|---|---|---|
| H01L 21/336 | (2006.01) | |
| H01L 27/095 | (2006.01) | |
| H01L 29/66 | (2006.01) | |
| H01L 29/423 | (2006.01) | |
| H01L 29/778 | (2006.01) | |
| H01L 29/812 | (2006.01) | |
| H01L 29/16 | (2006.01) | |
| H01L 29/205 | (2006.01) | |
| H01L 29/20 | (2006.01) | |
| H01L 21/8232 | (2006.01) | |

(52) U.S. Cl.
CPC .......... *H01L 27/095* (2013.01); *H01L 21/8232* (2013.01); *H01L 29/1608* (2013.01); *H01L 29/2003* (2013.01); *H01L 29/205* (2013.01); *H01L 29/4238* (2013.01); *H01L 29/66068* (2013.01); *H01L 29/66462* (2013.01); *H01L 29/66863* (2013.01); *H01L 29/7787* (2013.01); *H01L 29/812* (2013.01)

(58) Field of Classification Search
CPC ............ H01L 27/095; H01L 29/66863; H01L 29/66462; H01L 29/4238; H01L 29/66068; H01L 29/7787; H01L 29/812; H01L 29/1608; H01L 29/205; H01L 29/2003; H01L 21/8232
See application file for complete search history.

(56) References Cited

U.S. PATENT DOCUMENTS 8,357,571 B2    1/2013    Radulescu et al.

*Primary Examiner* — Long Pham
(74) *Attorney, Agent, or Firm* — Myers Bigel Sibley & Sajovec

(57) ABSTRACT

A first dielectric layer including a first opening is provided on a first surface of a semiconductor layer. A second dielectric layer is provided on top of the first dielectric layer in the first opening. A first portion of the second dielectric layer is then removed, such that a second portion of the second dielectric layer remains in the first opening. The first dielectric layer is then removed, leaving only the second portion of the second dielectric layer on the surface of the semiconductor layer. An epitaxial layer or a base dielectric layer is grown on the exposed portions of the first surface of the semiconductor layer not covered by the second portion of the second dielectric layer. The second portion of the second dielectric layer is then removed to define one or more contact windows, and a contact metal is deposited in the one or more contact windows.

22 Claims, 18 Drawing Sheets

METHOD OF MANUFACTURING PRECISE SEMICONDUCTOR CONTACTS

FIELD OF THE DISCLOSURE

The present disclosure relates to contacts for semiconductors with precise geometries and methods for manufacturing the same.

BACKGROUND

A Schottky barrier device is a type of semiconductor device that utilizes the properties of a potential barrier formed between a metal-semiconductor junction to perform one or more functions. A typical Schottky barrier device may include a wide band-gap semiconductor layer, on which one or more metal contacts are placed to form a Schottky interface. Some exemplary Schottky barrier devices include Schottky diodes, high electron mobility transistors (HEMTs), and metal-semiconductor field-effect transistors (MESFETs). A HEMT incorporates a junction between one or more HEMT epilayers having a first band-gap and a semiconductor layer having a second band-gap (i.e., a heterojunction), at which a two-dimensional electron gas is formed, allowing electrons to flow between a drain contact and a source contact. The potential barrier formed by a Schottky interface between a gate contact metal and the semiconductor layer is used to control the flow of electrons through the channel. Similarly, a MESFET uses a doped channel located in a semiconductor layer to allow electrons to flow between a drain contact and a source contact. Again, the potential barrier formed by a Schottky interface between a gate contact metal and the semiconductor layer is used to control the flow of electrons through the doped channel.

The geometry of the contact metal that forms the Schottky interface with the semiconductor layer may dictate several performance characteristics of the Schottky barrier device. For example, the speed of the Schottky barrier device may be directly related to the geometry of the contact metal. Generally, the smaller the area of the contact metal at the surface of the semiconductor layer where the Schottky interface is formed, the faster the Schottky barrier device can operate. Accordingly, many methods for forming contacts for a Schottky barrier device have focused on reducing the area of the contact metal at the surface of the semiconductor layer.

FIGS. 1A-1C and the accompanying flow chart shown in FIG. 2 show a conventional process for creating a Schottky contact in a Schottky barrier device. To begin, a first dielectric layer 10 is provided on a first surface of a semiconductor layer 12 (FIG. 1A and step 100). The first dielectric layer 10 is then etched to form a contact window 14, through which a portion of the first surface of the semiconductor layer 12 is exposed (FIG. 1B and step 102). Notably, the etching process is a conventional photo-resist etching process, in which a photo-resistive mask is applied on top of the first dielectric layer 10 and patterned, and the portions of the first dielectric layer 10 exposed through the photo-resistive mask are etched away. As will be appreciated by those of ordinary skill in the art, conventional photo-resist etching processes lack the precision required to create features below a certain size. Accordingly, the lower limit of the area of the contact window 14 is constrained by the photo-resist etching process. Finally, a contact metal 16 is deposited on the portion of the first surface of the semiconductor layer 12 exposed through the contact window 14 (FIG. 1C and step 104). As shown in FIG. 1C, a length 18 of the contact metal 16 at the first surface of the semiconductor layer 12 corresponds with the dimensions of the contact window 14, and is therefore constrained by the precision of the photo-resist etching process.

FIGS. 3A-3E and the accompanying flow chart shown in FIG. 4 show a process for creating a Schottky contact for a Schottky barrier device with improved precision, as described in U.S. Pat. No. 8,357,571, which is incorporate herein by reference in its entirety. To begin, a first dielectric layer 20 is provided on a first surface of a semiconductor layer 22 (FIG. 3A and step 200). The first dielectric layer 20 is then etched to form a first opening 24, through which a portion of the first surface of the semiconductor layer 22 is exposed (FIG. 3B and step 202). Notably, the etching process is a conventional photo-resist etching process, as described above. Accordingly, the lower limit of the area of the first opening 24 is constrained by the photo-resist etching process used to generate the opening. In an attempt to control the area of the first opening 24 with additional precision, a second dielectric layer 26 is provided on a surface of the first dielectric layer 20 opposite the semiconductor layer 22 and in the first opening 24 (FIG. 3C and step 204). A first portion of the second dielectric layer 26 is then etched away, leaving a second portion of the second dielectric layer 26 on the sidewalls of the first opening 24 (FIG. 3D and step 206). The second portion of the second dielectric layer 26 defines a contact window 28, which is smaller than the area of the first opening 24, and through which a portion of the first surface of the semiconductor layer 22 is exposed. A contact metal 30 is then deposited on the portion of the first surface of the semiconductor layer 22 exposed through the first opening 24, as modified by the second dielectric layer 26 (FIG. 3E and step 208). Using the second dielectric layer 26 to modify the first opening 24 allows the area of the contact window 28 to be controlled to a greater degree of precision, thereby decreasing a length 32 of the contact metal. However, the process described above may still have difficulty creating contacts below a certain size. Accordingly, there is a need for a process for precisely manufacturing contacts for semiconductor devices with precise geometries.

SUMMARY

The present disclosure relates to methods for manufacturing contacts for semiconductor devices with precise geometries. According to one embodiment, a first dielectric layer including a first opening is provided on a first surface of a semiconductor layer, such that the first opening defines an exposed portion of the first surface of the semiconductor layer. A second dielectric layer is provided on a surface of the first dielectric layer opposite the semiconductor layer, such that the second dielectric layer at least partially fills the first opening of the first dielectric layer. A first portion of the second dielectric layer is then removed, such that a second portion of the second dielectric layer remains in the first opening of the first dielectric layer. The first dielectric layer is then removed, leaving only the second portion of the second dielectric layer on the first surface of the semiconductor layer. According to different embodiments, an epitaxial layer or a base dielectric layer is grown on the exposed portions of the first surface of the semiconductor layer not covered by the second portion of the second dielectric layer. The second portion of the second dielectric layer is then removed to define one or more contact windows, and a contact metal is deposited in the one or more contact windows. By using the second portion of the second dielectric layer to define the one or more contact windows, the geometry of the contact metal can be precisely controlled. In some embodiments, for example, the length of the contact metal may be less than 0.01 µm.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
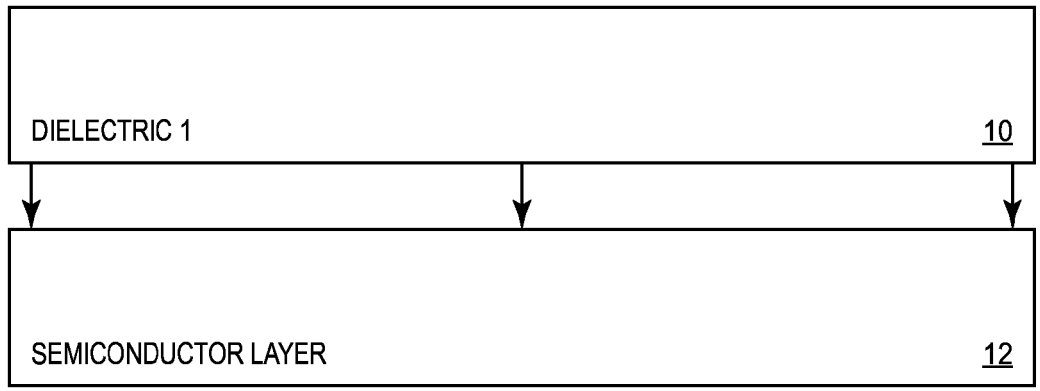
FIGS. 1A-1C illustrate a conventional process for creating a semiconductor contact.
Figure 1B:
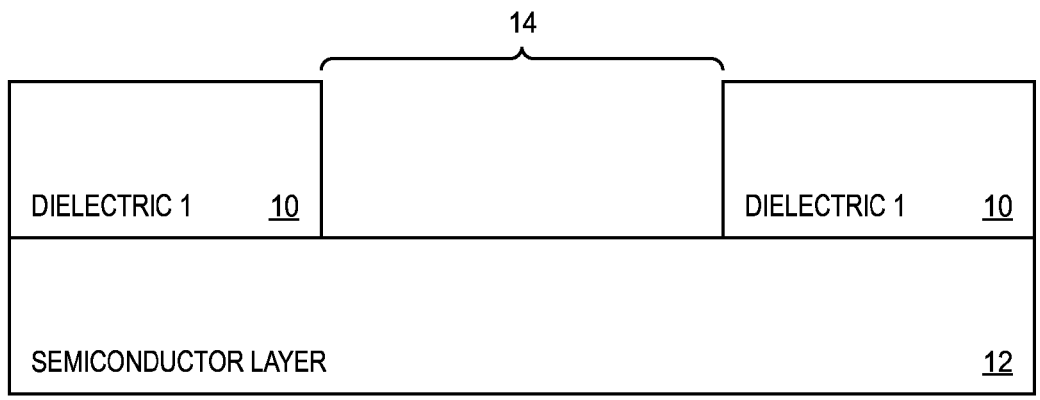
Figure 1C:
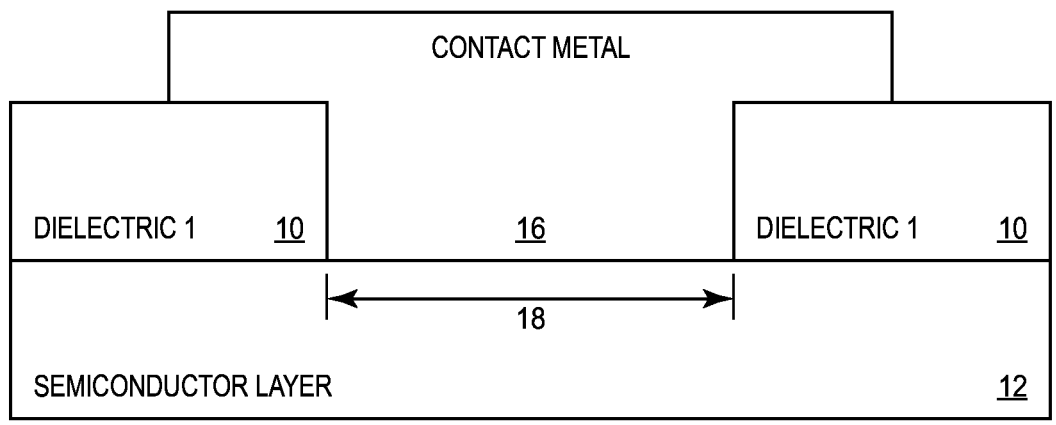
Figure 2:
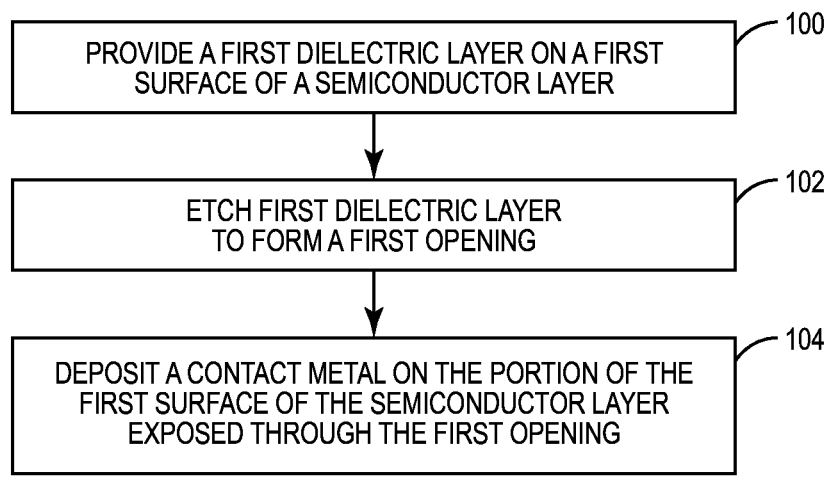
FIG. 2 is a flow diagram illustrating the process shown in FIGS. 1A-1C.
Figure 3A:
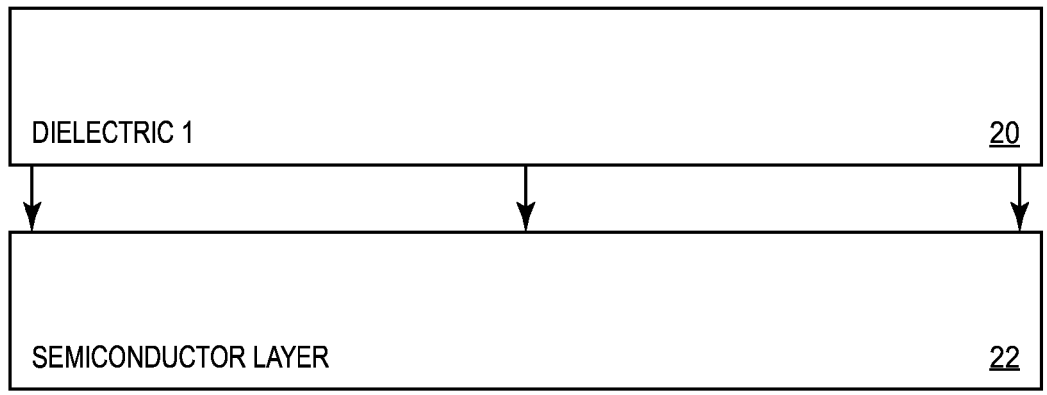
FIGS. 3A-3E illustrate an additional conventional process for creating a semiconductor contact with improved precision.
Figure 3B:
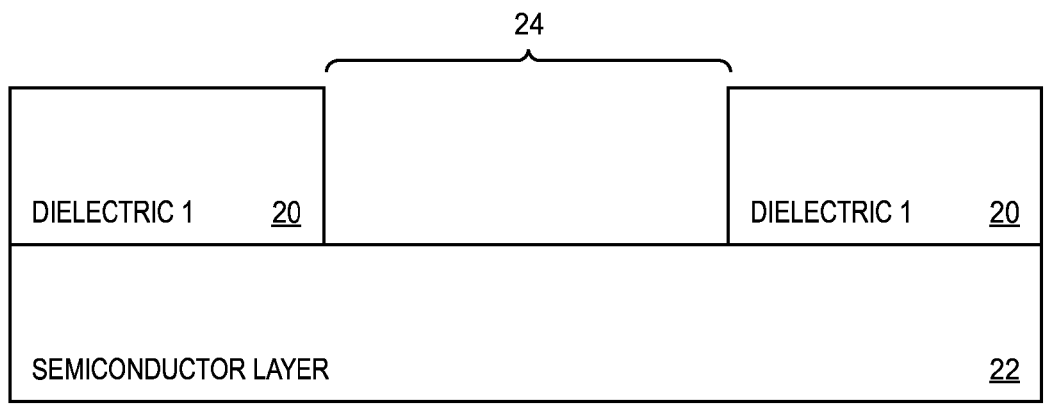
Figure 3C:
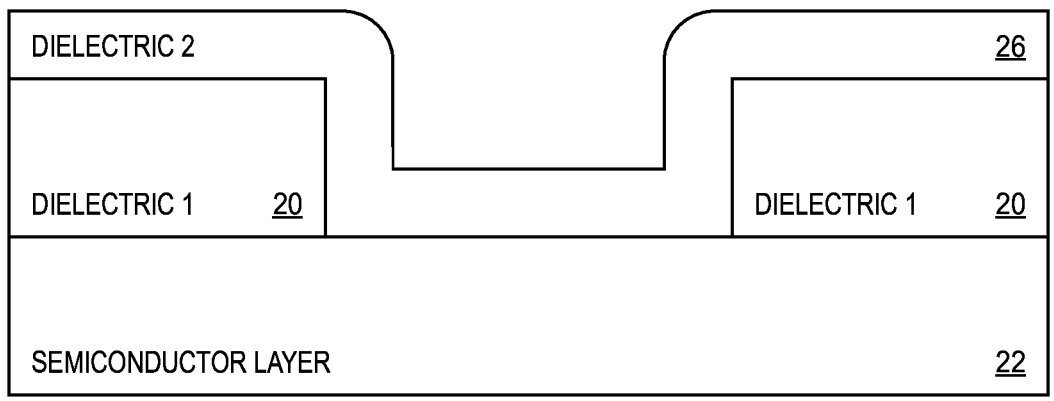
Figure 3D:
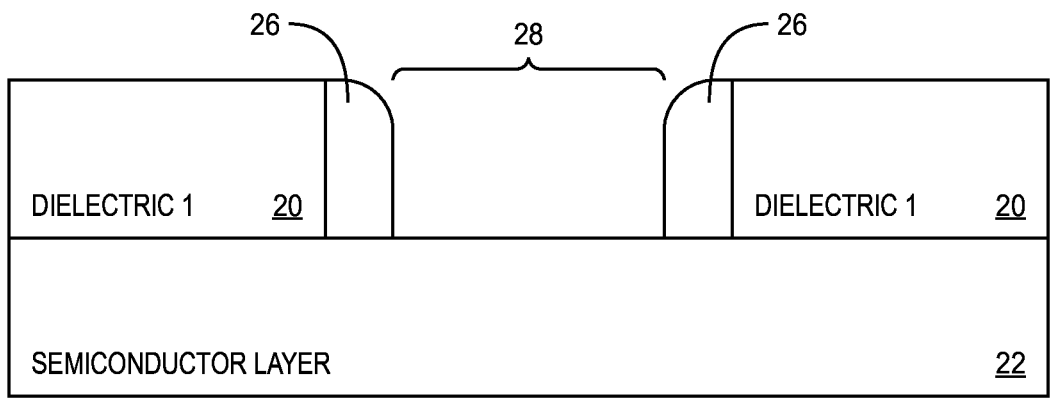
Figure 3E:
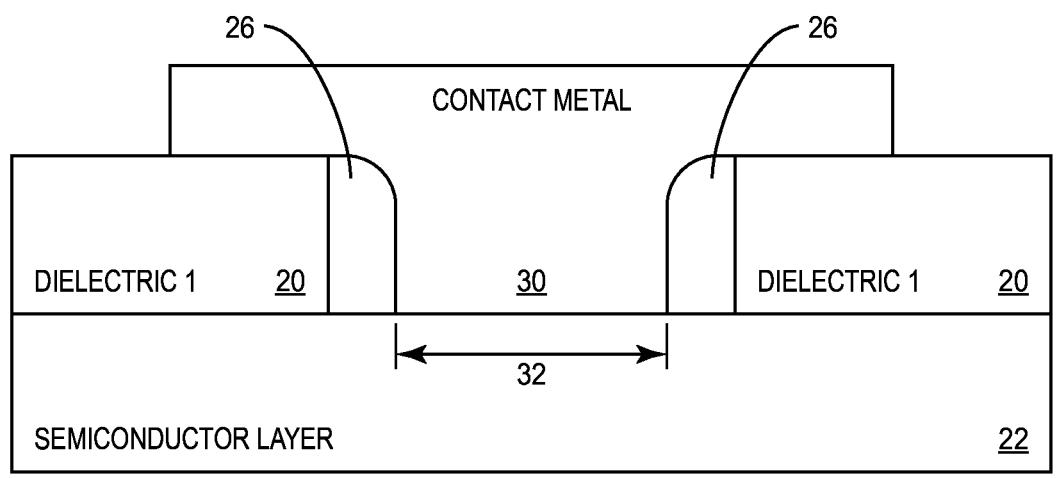
Figure 4:
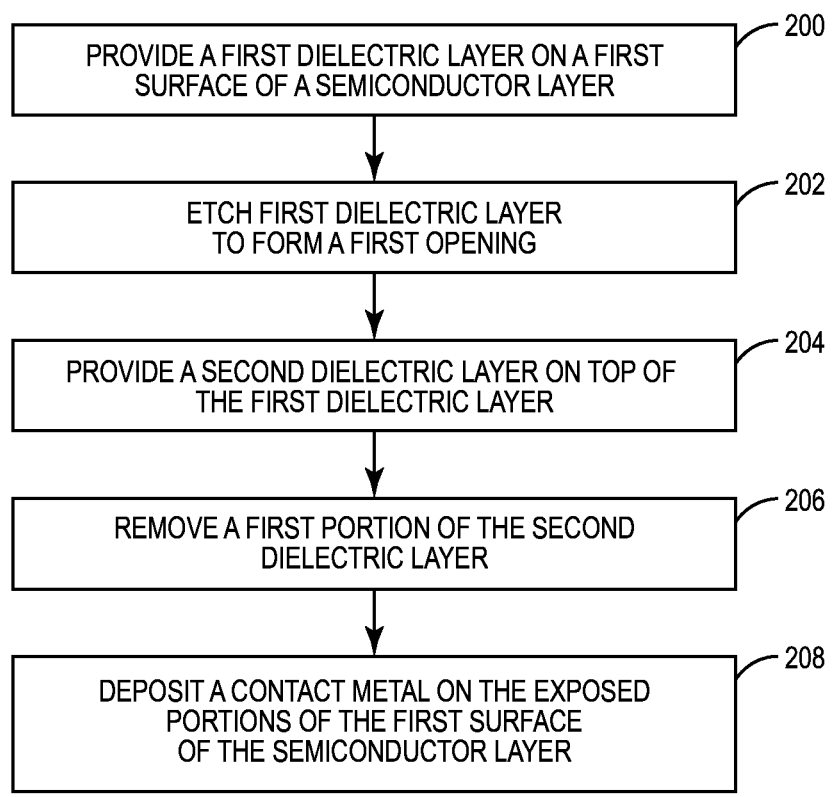
FIG. 4 is a flow diagram illustrating the process shown in FIGS. 3A-3E.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 5A:
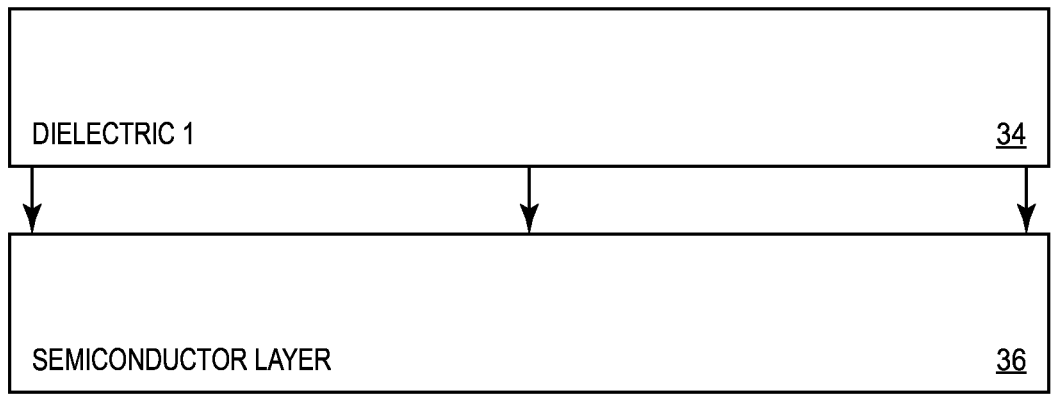
FIGS. 5A-5J illustrate a process for creating a semiconductor contact according to one embodiment of the present disclosure.
Figure 5B:
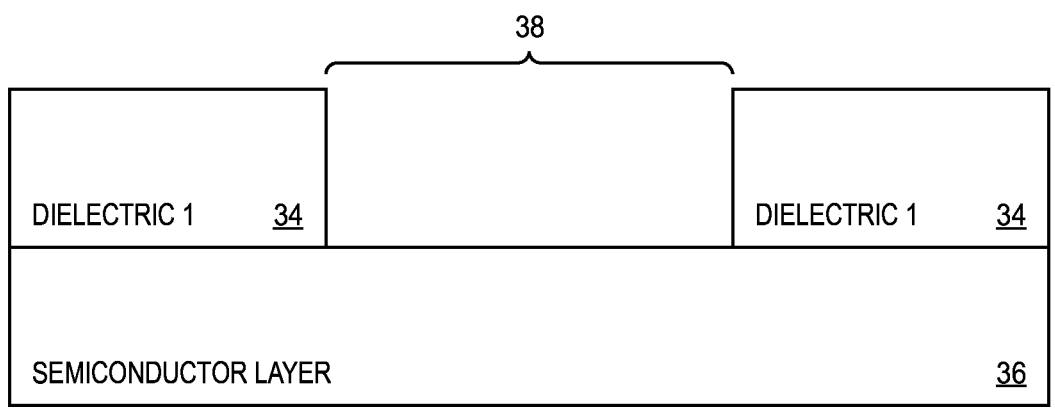
Figure 5C:
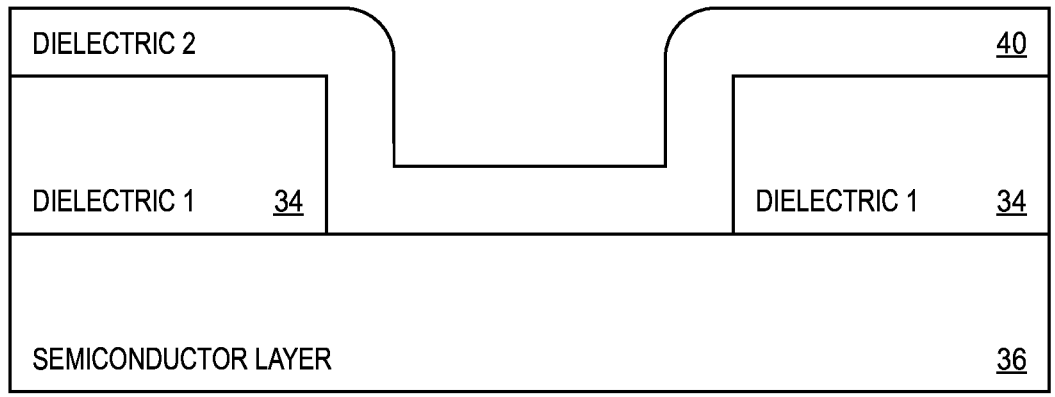
Figure 5D:
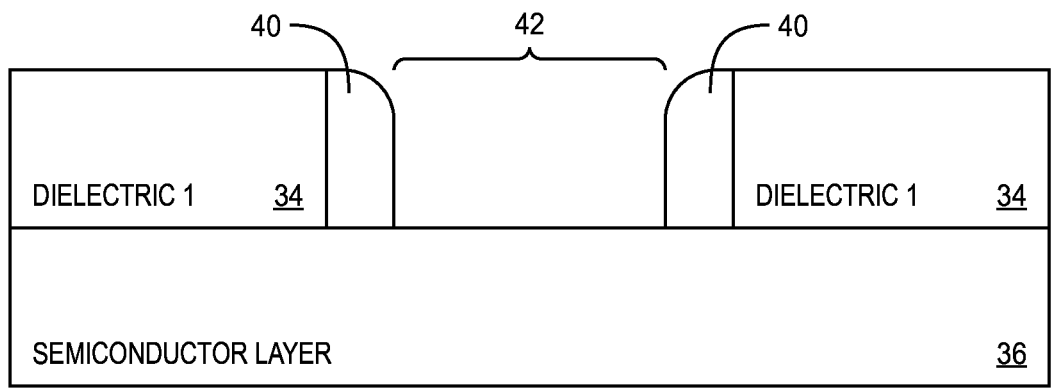
Figure 5E:
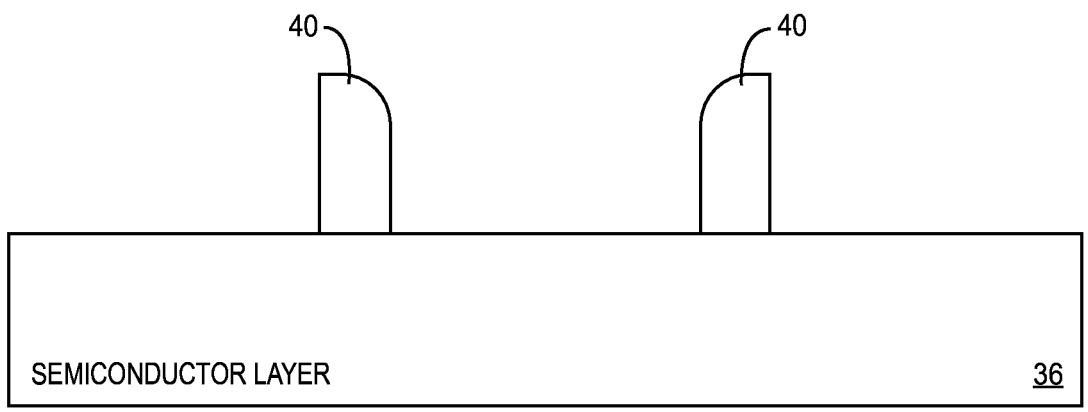
Figure 5F:
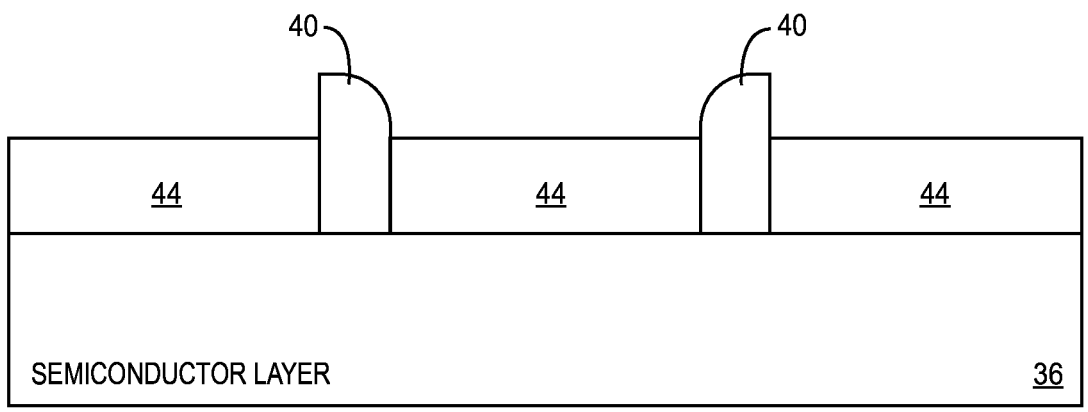
Figure 5G:
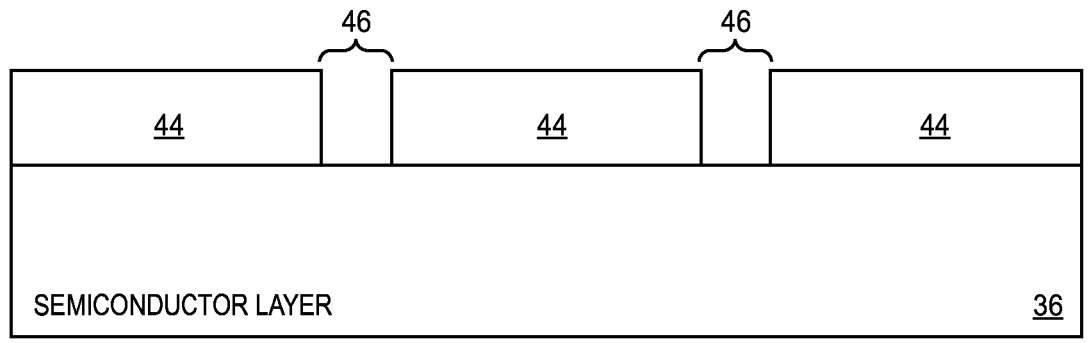
Figure 5H:
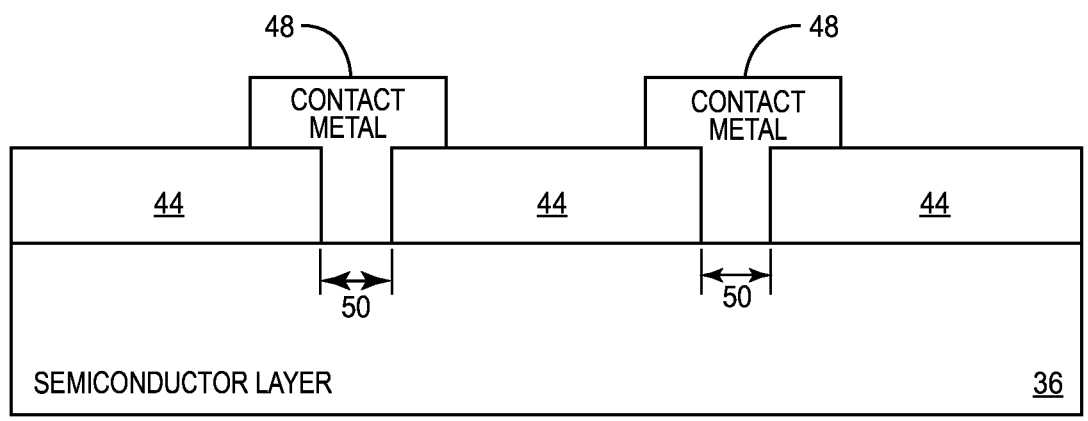
Figure 5I:
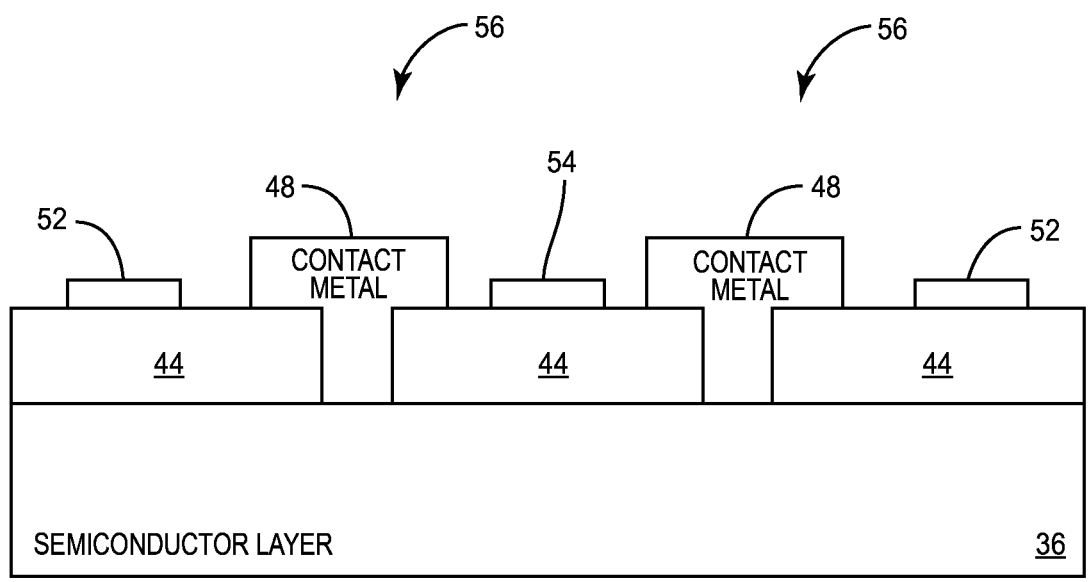
Figure 5J:
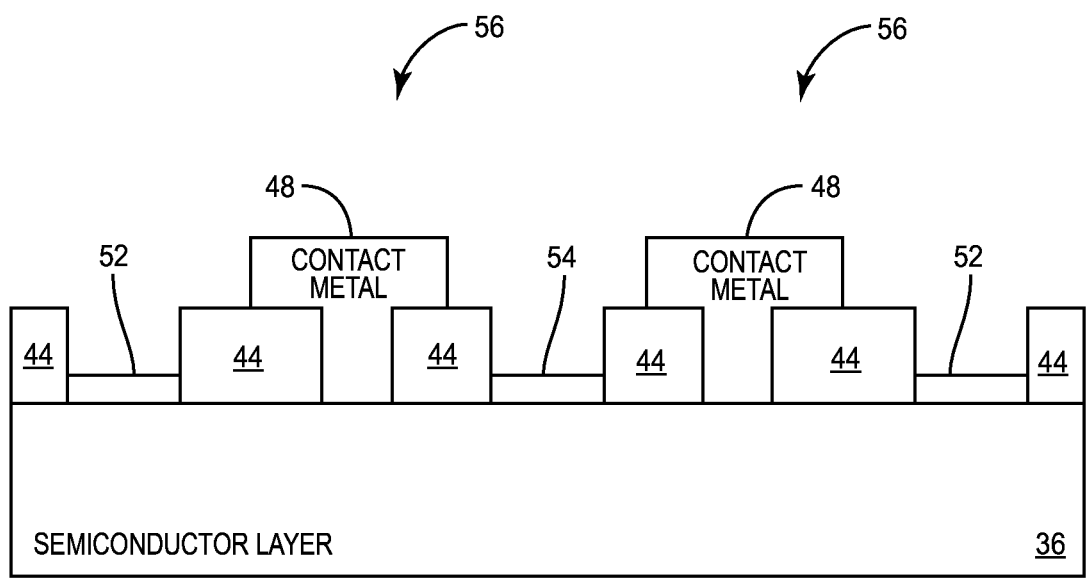
Figure 6:
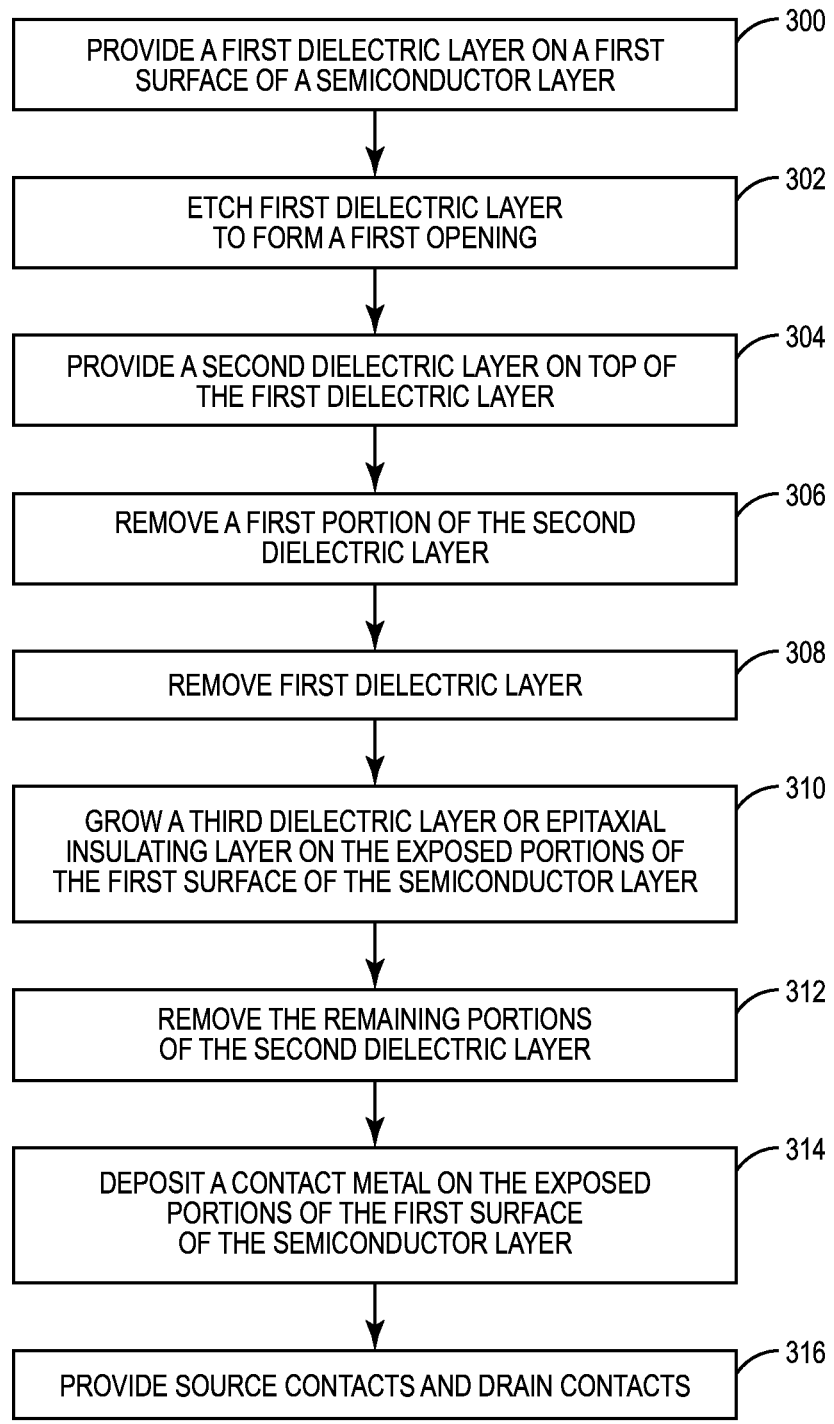
FIG. 6 is a flow diagram illustrating the process shown in FIGS. 5A-5I.

Turning now to FIGS. 5A-5J and the accompanying flow chart shown in FIG. 6, a process for creating a semiconductor contact with a precise geometry is shown according to one embodiment of the present disclosure. To begin, a first dielectric layer 34 is provided on a first surface of a semiconductor layer 36 (FIG. 5A and step 300). In one embodiment, the first dielectric layer 34 has a thickness in the range of 0.1-0.2 µm, and the semiconductor layer 36 has a thickness in the range of 0.2-2.0 µm. The first dielectric layer 34 is then etched to form a first opening 38, through which a portion of the first surface of the semiconductor layer 36 is exposed (FIG. 5B and step 302). As discussed above, the etching process may be a conventional photo-resist etching process, wherein a photo-resistive mask is applied to the first dielectric layer 34 and patterned, and the portion of the first dielectric layer 34 exposed through the photo-resistive mask is etched away.

A second dielectric layer 40 is then provided on the surface of the first dielectric layer 34 opposite the semiconductor layer 36 and in the first opening 38, such that the second dielectric layer 40 at least partially fills the first opening 38 (FIG. 5C and step 304). Notably, the sidewall coverage and the thickness of second dielectric layer 40 dictates will dictate one or more geometric parameters of the final device, as discussed in further detail below. According to one embodiment, the thickness of the second dielectric layer 40 is from about 0.01 µm to about 0.5 µm. A first portion of the second dielectric layer 40 is then etched away, leaving a second portion of the second dielectric layer 40 in the first opening 38. According to one embodiment, the first portion of the second dielectric layer 40 may be removed by an anisotropic etch process, however, those of ordinary skill in the art will appreciate that the first portion of the second dielectric layer 40 may be removed using any suitable process without departing from the principles of the present disclosure. The second portion of the second dielectric layer 40 may remain on the sidewalls of the first opening 38 on the first surface of the semiconductor layer 36, such that a second opening 42 modifies the first opening 38 to expose a smaller portion of the first surface of the semiconductor layer 36 (FIG. 5D and step 306). In one embodiment, the second portion of the second dielectric layer 40 remaining on the sidewalls of the first opening 38 has a width in the range of 20.0-500.0 μm.

The first dielectric layer 34 is then removed, for example, by an etching process, such that only the second portion of the second dielectric layer 40 remains on the first surface of the semiconductor layer 36 (FIG. 5E and step 308). Those of ordinary skill in the art will appreciate that any suitable etching process may be used to remove the first dielectric layer 34. A third layer 44 is then grown on the exposed portion of the first surface of the semiconductor layer 36 not covered by the second portion of the second dielectric layer 40 (FIG. 5F and step 310). According to one embodiment, the third layer 44 is a semiconductor epi regrowth layer. According to an additional embodiment, the third layer 44 is an epitaxial insulating layer. Any suitable epitaxial or dielectric regrowth process may be used to generate the third layer 44, as will be appreciated by those of ordinary skill in the art. The second portion of the second dielectric layer 40 is then removed, for example, by a selective etch process (FIG. 5G and step 312). The exposed portion of the first surface of the semiconductor layer 36 from which the second portion of the second dielectric layer 40 was removed defines one or more contact windows 46, which, due to the control provided by the process above, may have very precise geometries.

According to one embodiment, the length of each of the one or more contact windows 46 is less than or equal to about 0.1 μm. In one preferred embodiment, the length of each one of the contact windows 46 is less than or equal to about 0.02 μm. In an additional preferred embodiment, the length of each one of the one or more contact windows 46 is less than or equal to about 0.01 μm.

A contact metal 48 may be deposited on the portion of the first surface of the semiconductor layer 36 exposed through the one or more contact windows 46 and on a portion of a surface of the third layer 44 opposite the semiconductor layer 36 (FIG. 5H and step 314). As shown in FIG. 5H, a length of the contact metal 48 at the surface of the semiconductor layer 36 corresponds with the dimensions of the contact windows 46, which may be kept very small when using the described process. The contact metal 48 may form a gate contact for a transistor device, such as a high electron mobility transistor (HEMT) or a metal-semiconductor field-effect transistor (MESFET). Accordingly, one or more source contacts 52 and one or more drain contacts 54 may be provided in order to form one or more transistor devices 56 (step 316 and FIGS. 5I and 5J).

In a first embodiment where the third layer 44 is a semiconductor epi regrowth layer, the one or more source contacts 52 and the one or more drain contacts 54 may be provided on the surface of the third layer 44 opposite the semiconductor layer 36, as shown in FIG. 5I. In a second embodiment where the third layer 44 is an insulating dielectric layer, an additional step may be required, wherein the third layer 44 is selectively etched to expose one or more portions of the first surface of the semiconductor layer 36, on which the one or more source contacts 52 and the one or more drain contacts 54 are directly provided, as shown in FIG. 5J.

According to one embodiment, the first dielectric layer 34 may be a dielectric layer that has a relatively high breakdown field strength and provides a relatively low interface trap density at the interface with the semiconductor layer 36. The first dielectric layer 34 may have a high etch selectivity with respect to the semiconductor layer 36 and the second dielectric layer 40, and may not be reactive to the material of the underlying layers. Moreover, the first dielectric layer 34 may have a low level of impurities, such as hydrogen, oxygen, fluorine, and chlorine. The first dielectric layer 34 may be stable at relatively high temperatures (e.g., >1000° C.) in order to withstand high annealing temperatures that may be used in subsequent process steps.

According to one embodiment, the semiconductor layer 36 may be a Group III nitride. As used herein, the term "Group III nitride" refers to those semiconducting compounds formed between nitrogen and the elements in Group III of the periodic table, commonly aluminum (Al), gallium (Ga), and/or indium (In), and also to ternary and quaternary compounds such as aluminum gallium nitride (AlGaN) and aluminum indium gallium nitride (AlInGaN). According to an additional embodiment, the semiconductor layer 36 may be silicon carbide (SiC). Other materials systems, such as sapphire, silicon, gallium arsenide (GaAs), indium phosphide (InP), may also be used for the semiconductor layer 36. Those of ordinary skill in the art will appreciate that the principles of the present disclosure may be applied to semiconductor devices comprising any number of materials systems, all of which are contemplated herein.

The semiconductor layer 36 may include one or more internal layers, such as one or more buffer layers and/or other layers as discussed below with respect to HEMTs and MESFETs. Further, the semiconductor layer 36 may include one or more implants, such as one or more source implants or one or more drain implants, as required to generate the necessary functionality of a transistor device.

According to one embodiment, the second dielectric layer 40 may be similar to the first dielectric layer 34 and may include the same materials discussed above with respect to the first dielectric layer 34. However, the second dielectric layer 40 may have a high etch selectivity with respect to the first dielectric layer 34 and the semiconductor layer 36, and may not be reactive to the material of the underlying layers. Further, although the second dielectric layer 40 is referred to as such, other suitable insulators or other non-metal materials that are not dielectrics may be used for the second dielectric layer 40 without departing from the principles of the present disclosure.

According to one embodiment, the contact metal 48, the drain contacts 54, and the source contacts 52, may be comprised of one or more metal layers. For example, each one of the contact metal 48, the drain contacts 54, and the source contacts 52 may comprise gold, nickel, platinum, copper, titanium, or another conductive metal. In one exemplary embodiment, each one of the contact metal 48, the drain contacts 54, and the source contacts 52 include a first layer of nickel or nickel-aluminum, a second layer of titanium over the first layer, and a third layer of titanium-nickel over the second layer, and a fourth layer of aluminum over the third layer. Those of ordinary skill in the art will appreciate that the contact metal 48, the drain contacts 54, and the source contacts 52 may comprise any suitable materials or combination thereof without departing from the principles of the present disclosure.

As discussed above, the third layer 44 may be an epitaxial insulating layer or a base dielectric regrowth layer. In the case of an epitaxial insulating layer, the third layer 44 may comprise, for example, GaN, AlGaN, AlN, InN, InGaN, or InAlGaN. In the case of a base dielectric regrowth layer, the third layer 44 may comprise, for example, an oxide (e.g. SiO, $Al_2O_3$) or a nitride (e.g SiN). According to one embodiment, the third layer 44 has a thickness in the range of 0.1-1.0 μm.

Figure 7A:
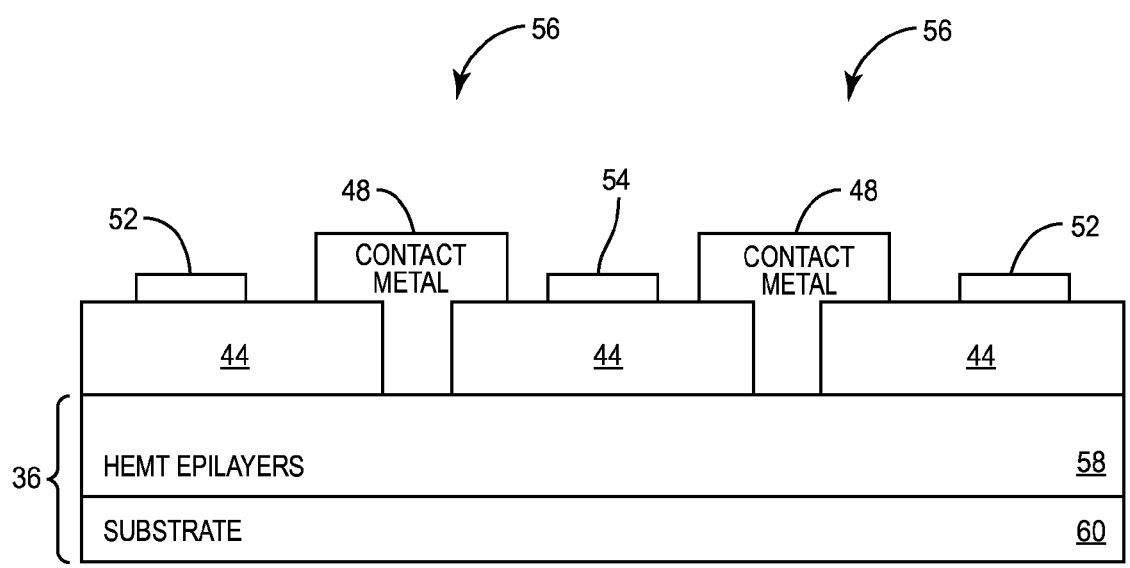
FIGS. 7A and 7B are schematic representations of a transistor device created by incorporating the process shown in FIGS. 5A-5I according to one embodiment of the present disclosure.
Figure 7B:
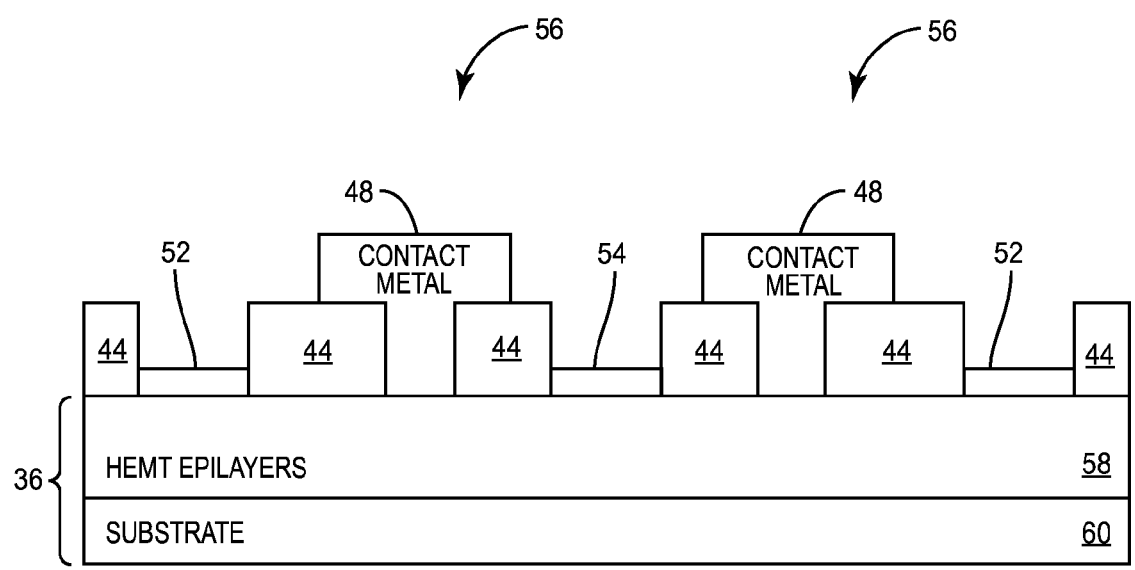

FIGS. 7A and 7B show one or more transistor devices 56 created by the process described above according to various embodiments of the present disclosure. As shown in FIG. 7A, the semiconductor layer 36 may include one or more HEMT epilayers 58 located between a substrate 60 and the third layer 44, such that the one or more transistor devices are HEMTs. The HEMT epilayers 58 may be provided sequentially on the substrate 60. In the embodiment shown in FIG. 7A, the third layer 44 is a semiconductor epi regrowth layer, as discussed above, and therefore may be part of the HEMT epilayers 58. Accordingly, the one or more source contacts 52 and the one or more drain contacts 54 are provided on the surface of the third layer 44 opposite the semiconductor layer 36. As will be understood by those of ordinary skill in the art, a two-dimensional electron gas is formed at the interface between the HEMT epilayers 58 and the substrate 60, which creates a channel through which current can flow between an associated pair of source contacts 52 and drain contacts 54. The Schottky interface between the contact metal 48 and the HEMT epilayers 58 controls the amount of current flow in the channel.

FIG. 7B shows the one or more transistor devices 56 shown in FIG. 7A wherein the third layer 44 is an insulating dielectric layer. As shown in FIG. 7B, the third layer 44 is etched to provide direct access to the HEMT epilayers 58. Accordingly, in this embodiment, the source contacts 52 and the drain contacts 54 are provided directly on the HEMT epilayers 58.

Figure 8A:
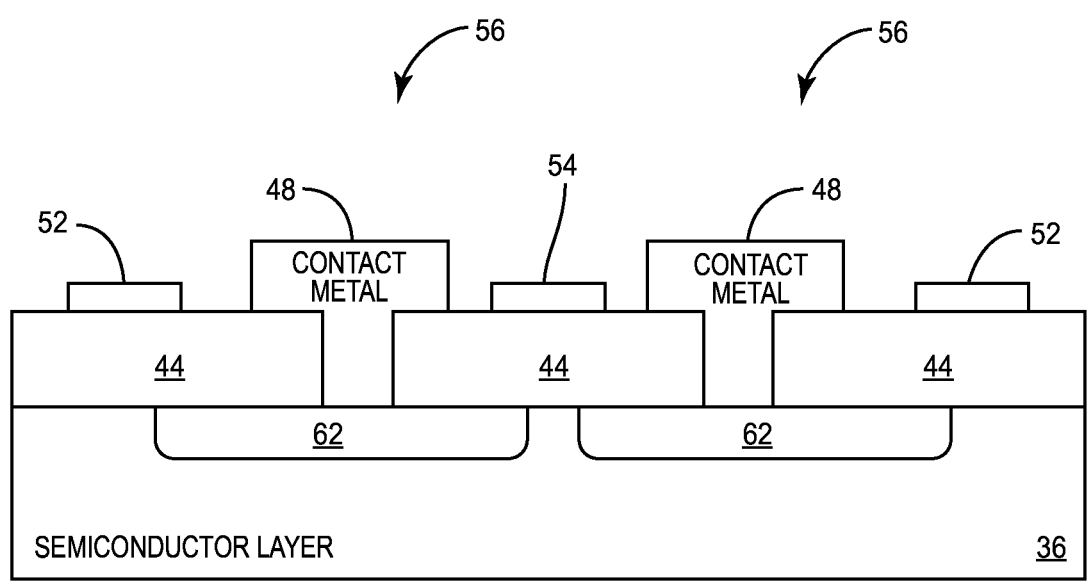
FIGS. 8A and 8B are schematic representations of a transistor device created by incorporating the process shown in FIGS. 5A-5J according to an additional embodiment of the present disclosure.
Figure 8B:
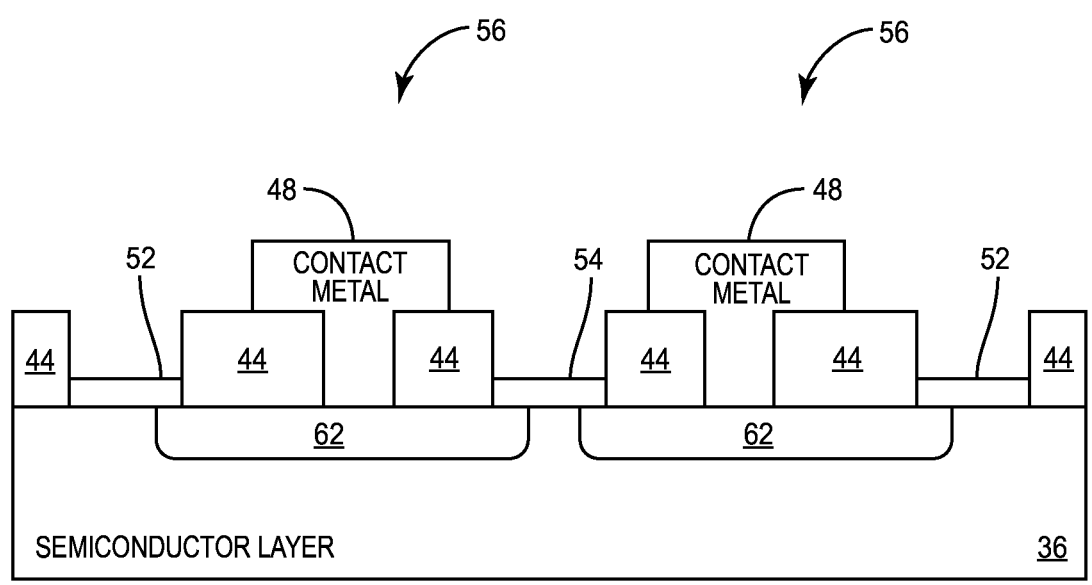

FIGS. 8A and 8B show one or more transistor devices 56 created by the process described above according to various embodiments of the present disclosure. As shown in FIG. 8A, the semiconductor layer 36 may include a doped channel 62 between each associated pair of source contacts 52 and drain contacts 54, such that the one or more transistor devices 56 are MESFETs. In the embodiment shown in FIG. 8A, the third layer 44 is a semiconductor epi regrowth layer, as discussed above, and therefore may be part of the semiconductor layer 36. Accordingly, the one or more source contacts 52 and the one or more drain contacts 54 are provided on the surface of the third layer 44 opposite the semiconductor layer 36. As will be understood by those of ordinary skill in the art, the doped channel 62 between each associated pair of source contacts 52 and drain contacts 54 enables the flow of current between the contacts. The Schottky interface between the contact metal 48 and the semiconductor layer 36 controls the amount of current flow in the doped channel 62.

FIG. 8B shows the one or more transistor devices 56 shown in FIG. 8A wherein the third layer 44 is an insulating dielectric layer. As shown in FIG. 8B, the third layer 44 is etched to provide direct access to the semiconductor layer 36. Accordingly, in this embodiment, the source contacts 52 and the drain contacts 54 are provided directly on the semiconductor layer 36.

Those skilled in the art will recognize improvements and modifications to the preferred embodiments of the present disclosure. All such improvements and modifications are considered within the scope of the concepts disclosed herein and the claims that follow.

What is claimed is:

1. A method comprising the steps of:
   providing a first dielectric layer including a first opening on a first surface of a semiconductor layer, such that the first opening defines an exposed portion of the first surface of the semiconductor layer;
   providing a second dielectric layer on a surface of the first dielectric layer opposite the semiconductor layer and in the first opening;
   removing a first portion of the second dielectric layer, such that a second portion of the second dielectric layer remains in the first opening;
   substantially removing the first dielectric layer;
   growing an epitaxial layer on the exposed portion of the first surface of the semiconductor layer not covered by the second portion of the second dielectric layer; and
   removing the second portion of the second dielectric layer to define one or more contact windows in the epitaxial insulating layer through which a portion of the first surface of the semiconductor layer is exposed.

2. The method of claim 1 further comprising the step of depositing a contact metal in the one or more contact windows to form one or more Schottky contacts.

3. The method of claim 2 wherein the one or more Schottky contacts are gate contacts for a transistor device.

4. The method of claim 3 further comprising the steps of:
   providing a drain region in the first surface of the semiconductor layer adjacent to each gate contact; and
   providing a source region in the first surface of the semiconductor layer adjacent to each gate contact and opposite the drain region.

5. The method of claim 3 wherein the transistor device is a high electron mobility transistor (HEMT).

6. The method of claim 3 wherein the transistor device is a metal semiconductor field effect transistor (MESFET).

7. The method of claim 1 wherein each of the one or more contact windows has a width less than about 0.02 μm.

8. The method of claim 1 wherein each of the one or more contact windows has a width less than about 0.01 μm.

9. The method of claim 1 wherein providing the first dielectric layer including the first opening on the first surface of the semiconductor layer comprises:
   providing the semiconductor layer;
   providing the first dielectric layer on the first surface of the semiconductor layer; and
   patterning the first dielectric layer to form the first opening.

10. The method of claim 1 wherein the second portion of the second dielectric layer is located on sidewalls of the first opening.

11. The method of claim 1 wherein the semiconductor layer comprises one of gallium nitride (GaN) and silicon carbide (SiC).

12. A method comprising the steps of:
   providing a first dielectric layer including a first opening on a first surface of a semiconductor layer, such that the first opening defines an exposed portion of the first surface of the semiconductor layer;
   providing a second dielectric layer on the surface of the first dielectric layer opposite the semiconductor layer and in the first opening;
   removing a first portion of the second dielectric layer, such that a second portion of the second dielectric layer remains in the first opening;
   removing the first dielectric layer;

growing a base dielectric layer on the exposed portion of the first surface of the semiconductor layer not covered by the second portion of the second dielectric layer; and removing the second portion of the second dielectric layer to define one or more contact windows in the base dielectric layer through which a portion of the first surface of the semiconductor layer is exposed.

13. The method of claim 12 further comprising the step of depositing a contact metal in the one or more contact windows to form one or more Schottky contacts.

14. The method of claim 13 wherein the one or more Schottky contacts are gate contacts for a transistor device.

15. The method of claim 14 further comprising the steps of:
providing a drain region in the first surface of the semiconductor layer adjacent to each gate contact; and
providing a source region in the first surface of the semiconductor layer adjacent to each gate contact and opposite the drain region.

16. The method of claim 14 wherein the transistor device is a high electron mobility transistor (HEMT).

17. The method of claim 14 wherein the transistor device is a metal-semiconductor field-effect transistor (MESFET).

18. The method of claim 12 wherein each of the one or more contact windows has a width less than about 0.02 μm.

19. The method of claim 12 wherein each of the one or more contact windows has a width less than about 0.01 μm.

20. The method of claim 12 wherein providing the first dielectric layer including the first opening on the first surface of the semiconductor layer comprises:
providing the semiconductor layer;
providing the first dielectric layer on the first surface of the semiconductor layer; and
patterning the first dielectric layer to form the first opening.

21. The method of claim 12 wherein the second portion of the second dielectric layer is located on sidewalls of the first opening.

22. The method of claim 12 wherein the semiconductor layer comprises one of gallium nitride (GaN) and silicon carbide (SiC).

* * * * *